United States Patent [19]

Kindermann et al.

[11] Patent Number: 5,329,239

[45] Date of Patent: Jul. 12, 1994

[54] CIRCUIT FOR MEASURING A CAPACITANCE DURING CONSTANT CHARGING AND DISCHARGING PERIODS

[75] Inventors: Robert Kindermann; Klaus Styhler; Herbert Ziegler, all of Nürnberg, Fed. Rep. of Germany

[73] Assignee: ABB Patent GmbH, Mannheim, Fed. Rep. of Germany

[21] Appl. No.: 886,506

[22] Filed: May 20, 1992

[30] Foreign Application Priority Data

May 24, 1991 [DE] Fed. Rep. of Germany ....... 4116961

[51] Int. Cl.$^5$ ............................................. G01R 27/26
[52] U.S. Cl. ..................................... 324/678; 324/679
[58] Field of Search ............... 324/676, 677, 678, 679, 324/605; 361/111; 307/106

[56] References Cited

U.S. PATENT DOCUMENTS

| | | | |
|---|---|---|---|
| 2,601,491 | 6/1952 | Baker | 324/677 |
| 3,761,805 | 9/1973 | Dornberger | 324/677 |
| 3,824,459 | 7/1974 | Uchida | 324/679 |
| 4,217,543 | 9/1980 | Strong | 324/677 |
| 4,429,271 | 1/1984 | Doubek et al. | 324/677 |
| 4,743,837 | 5/1988 | Herzog | 324/678 |
| 4,825,147 | 4/1989 | Cook et al. | 324/678 |
| 4,870,528 | 9/1989 | Harford | 361/111 |
| 5,038,245 | 8/1991 | Gronskog | 361/111 |
| 5,073,757 | 12/1991 | George | 324/677 |

*Primary Examiner*—Kenneth A. Wieder
*Assistant Examiner*—Glenn W. Brown
*Attorney, Agent, or Firm*—Herbert L. Lerner; Laurence A. Greenberg

[57] ABSTRACT

A measuring circuit for measuring a capacitance according to the discharge method includes a measuring circuit input. A constant voltage source charges a capacitor to be measured at the measuring circuit input. The capacitor discharges through a discharge resistor with a known resistance being connected to the capacitor. At least one switch is connected between the capacitor and the constant voltage source. A flow control is connected to the at least one switch for controlling the at least one switch. A comparator is connected to the capacitor. A counter is connected to the comparator for counting clock pulses during a discharge. A PTC element is connected to the measuring circuit input in series with the capacitor. A monitoring device is connected to the capacitor.

12 Claims, 1 Drawing Sheet

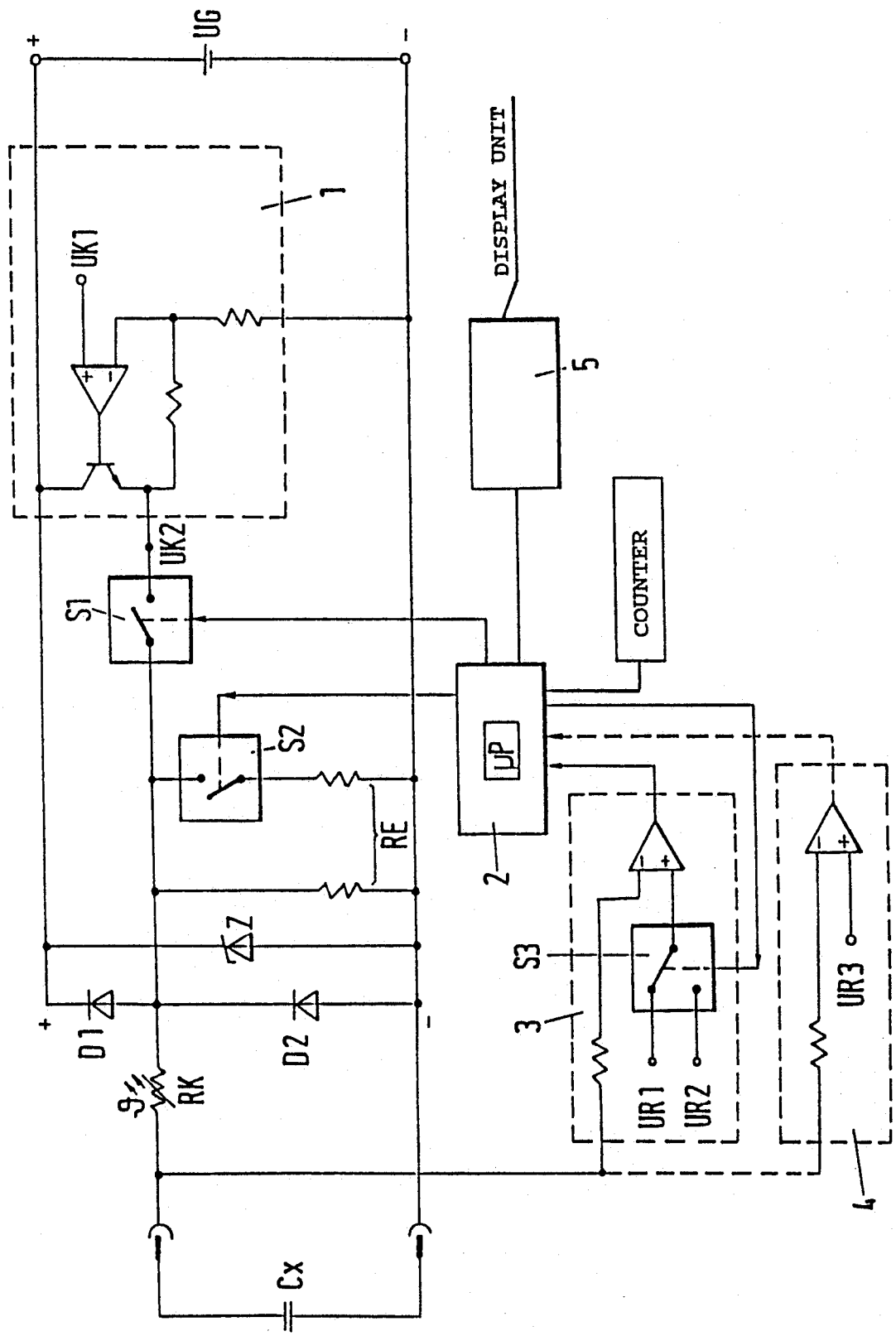

CIRCUIT FOR MEASURING A CAPACITANCE DURING CONSTANT CHARGING AND DISCHARGING PERIODS

SPECIFICATION

The invention relates to a measuring circuit for measuring a capacitance by the discharge method, including a constant voltage source for charging the capacitor, a discharge resistor with a known resistance through which a discharge of the capacitor takes place, a flow control for determining charging and discharging phases by controlling at least one suitably disposed switch, and a counter, preferably assigned to the flow control, for counting clock pulses during the discharge until a comparator signals that the discharge voltage at the capacitor has dropped below a specified first reference voltage and thus the discharge time is ended.

In the case of economical multimeters, the simplest possible measurement circuit for measuring capacitance is needed. A circuit configuration operating by the discharge principle that is known from DIN 41 328, sheet 4, Jun. 1974, has gained wide acceptance, because of its good measurement accuracy, among other factors. A capacitance Cx to be measured is charged to a previously defined reference voltage, and then discharged through a discharge resistor RE. A time from the onset of discharge until the drop of the voltage at the capacitor Cx to a specified value, is measured. The discharge takes place with a time constant $\tau = RE \cdot Cx$, and $Cx = k \cdot t$. In other words, the capacitance is proportional to the measured discharge time t as a function of the constant k. As a rule, measurement of the discharge time t is performed with the aid of a counter, which counts clock pulses during the discharge until a comparator signals that the voltage at the capacitor has reached the specified discharge voltage.

In order to switch back and forth between the charging and discharging phases, switches with low forward resistance are preferably used, so that the charge resistance for the capacitor, and therefore the charging time constant, remain as low as possible.

A circuit configuration that operates with an electronic switch is known from German Patent DE 28 36 324 C2. By including the switch in the negative feedback circuit of an operational amplifier, it becomes possible for the forward resistance of the switch not to become a factor in the measurement, so that it does not increase the charging or discharging time constant. At a low charge resistance, a fixedly specified charge time can be used, because even at high capacitances the charge time constant remains so low that adequate charging is always attained.

A factor of special significance for the utility of a multimeter is its security against external voltages, which can slip in through the specimen to be measured, or can also be created in the event that the measuring input is mistakenly connected to the wrong specimen to be measured. Provisions must therefore be made to prevent external voltages that may arise from causing destruction of components of the measuring circuit, which could cause failure of the multimeter or even be dangerous to human operators.

It is known to protect the input of measuring equipment with a cold conductor or PTC resistor or PTC element (PTC-positive temperature coefficient) combined with threshold value elements, preferably two diodes. The threshold value elements assure that excess voltages, depending on their polarity, are virtually short-circuited, and the resultant increased current through the PTC element heats it, producing a resultant current limitation. However, such protection circuits have not been used to measure capacitances because the relatively high resistance of a PTC element would undo all of the effort undertaken to attain a low charge resistance and thus a low charging time constant. Yet using fuses instead of the PTC element has the disadvantage that they have to be replaced once they blow.

It is accordingly an object of the invention to provide a measuring circuit for measuring a capacitance, which overcomes the hereinafore-mentioned disadvantages of the heretofore-known devices of this general type, which is especially suitable for economical multimeters, which contains components that protect against external voltages that are not destroyed in the case of a malfunction and thus need not be replaced, and in which a fixed charging time can be used without causing measurement errors in the case of high capacitances.

With the foregoing and other objects in view there is provided, in accordance with the invention, a measuring circuit for measuring a capacitance according to the discharge method, comprising a measuring circuit input; a constant voltage source for charging a capacitor to be measured at the measuring circuit input; a discharge resistor with a known resistance being connected to the capacitor and through which the capacitor discharges; at least one switch connected between the capacitor and the constant voltage source; a flow control being connected to the at least one switch for controlling the at least one switch to determine charging and discharging phases; a comparator connected to the capacitor; a counter, preferably associated with the flow control, being connected to the comparator for counting clock pulses during a discharge until the comparator signals that a discharge voltage at the capacitor has dropped below a given first reference voltage and therefore a discharge time is ended; a PTC element connected to the measuring circuit input in series with the capacitor for passing a charging current through the PTC element to protect against error voltages, for limiting a time constant for the charging being increased through the PTC element to a maximum value by a restriction of an allowable capacitance range, and for maintaining a charging time of the capacitor within a scope of typical measuring times; and monitoring means, acting upon the flow control and/or upon associated measured value processing means, for preventing incorrect indications and for detecting if, within the fixed given charging time, a charge voltage does not attain a given voltage value because the capacitor exceeds the maximum value of the allowable capacitance range.

In accordance with another feature of the invention, the monitoring means are in the form of at least one comparator for detecting attainment of a given minimum value of the charge voltage at the capacitor and for delivering a corresponding output signal to the flow control, being programmed for detecting if the given minimum value of the charge voltage was exceeded during the charging time, at an output signal of the corresponding comparator.

In accordance with a further feature of the invention, the monitoring means are in the form of the same comparator detecting the attainment of the given first discharge voltage with the aid of the reference voltage, the comparator detecting the attainment of a charge voltage corresponding to first the reference voltage and supplying a signal to the flow control, during the charging of the capacitor.

In accordance with an added feature of the invention, the monitoring means are in the form of the same comparator detecting the attainment of the given discharge voltage with the aid the first reference voltage, and a switchover between the reference voltage and another reference voltage being equivalent to the given charge voltage is effected, so that the comparator detects the attainment of a charge voltage corresponding to the other reference voltage and supplies a signal to the flow control, during the charging of the capacitor.

In accordance with an additional feature of the invention, there is provided another or second comparator having an input at a further reference voltage being equivalent to the given charge voltage, the other comparator detecting the attainment of a charge voltage equivalent to the other reference voltage and supplying a signal to the flow control, during the charging of the capacitor.

In accordance with yet another feature of the invention, the at least one first switch is a semiconductor switch connected between the constant voltage source and the PTC element, for interrupting the charging and beginning the discharging through the discharge resistor upon opening the at least one switch.

In accordance with yet a further feature of the invention, there is provided another or second controllable switch switching over for enabling a variation in resistance of the discharge resistor, the switchover of the other switch being intended to reduce resistance and taking place at correspondingly low resistances of the discharge resistor in alternation with the at least one first switch.

In accordance with yet an added feature of the invention, the measuring circuit input has first and second poles, and there is provided a direct voltage source for supplying the constant voltage source, and two threshold value elements, preferably diodes, disposed at the measuring circuit input upstream of the PTC element for short-circuiting external voltages of one polarity directly to the second pole of the measuring circuit input, and short-circuiting external voltages of the other polarity to the second pole of the measuring circuit input, through the direct voltage source.

In accordance with a concomitant feature of the invention, there is provided a Zener diode connected parallel to the direct voltage source.

Initially, the invention resides in a radical departure from the goal of attaining the lowest possible charging time constant by means of the lowest possible ohmic resistances in the charge circuit. This not only makes it possible to use a PTC element to protect against error voltages, but also makes it unnecessary to take special provisions for reducing the forward resistance of electronic switches, which is relatively high in comparison with mechanical switches. If the allowable capacitance measuring range is limited to suitable maximum values, which appears acceptable especially for economical multimeters, then a fixed charging time, which is still within a typical measuring time for such measurements, such as a maximum of 1 second, can be used.

A decisive factor is that with capacitances that exceed the allowable measuring range, misleading incorrect measurements are not made. However, unless suitable supplementary provisions are taken, incorrect measurements would be unavoidable, because an overly large capacitor would not charge to the specified final value for the charge voltage within the fixedly defined charging time. Upon discharging of the capacitor, which would automatically follow the charging time, the also-specified value of the discharge voltage would be reached faster, because the discharge would begin at a lower voltage. Accordingly, the shorter discharge time would misleadingly indicate a substantially lower capacitance. According to the invention, monitoring means are therefore provided, which monitor the charge voltage arising at any given time at the capacitor to be measured as to whether it attains the specified final value. This final value, depending on the measurement accuracy sought, is slightly below the voltage value of the constant voltage source. The monitoring means in this way act upon the flow control or the measuring value processing in such a way that incorrect indications are prevented, and instances where the capacitance is exceeded can be detected.

An especially advantageous further feature of the invention provides that preferably the same comparator that is already needed to monitor the attainment of the specified discharge voltage in the discharge process is used as the monitoring means. The comparator, which assumes a predetermined signal state once the discharging phase has been completed, is then reset to its second signal state only whenever the voltage present at its input exceeds a minimum value, specified as the reference voltage, during the charging phase. In the simplest case, this minimum value may be equal to the specified discharge voltage. If the minimum value is not attained during the charging time of the capacitor, then the flow control can interpret the absence of resetting of the comparator as an overly high capacitance and can trip a suitable signal, such as an overflow indication.

At the maximum allowable capacitance, the charge voltage precisely attains the specified final value during the fixed charging time. It would therefore be suitable to specify this final value to a second comparator as a reference value, in order to monitor whether or not the allowable capacitance range is exceeded. In that case, the flow control could interpret the absence of a signal change at the comparator as an unallowably high capacitance.

An alternative, which again makes do with only one comparator, provides that its reference voltage can be switched over in accordance with the charging or discharging phase, so that during the charging phase, a charge voltage corresponding to the final value is monitored, while during the discharging phase a voltage value corresponding to the discharge voltage is monitored. Once again, the flow control can conclude whether or not the measured capacitance is exceeding the allowable range, from the type of comparator signal.

A circuit layout that is substantially more economical than the measurement circuit of German Patent DE 28 36 324 C2 is attainable, in a further feature of the invention, by providing that the semiconductor switch needed for switching back and forth between the charging and discharging phase is not located in the negative feedback circuit of an operational amplifier but rather, because its junction resistance is negligible as compared with the PTC element, it is inserted directly into the charging/discharging circuit between the capacitance to be measured, or the PTC element preceding it, and the constant voltage source. If any operational amplifier at all is needed with this circuit layout, then an economical type can be used, in which such high demands need not be placed in terms of its rise speed, as compared with known circuits, and which accordingly also makes do with a lower supply current.

In the event of an especially large capacitance measuring range extending over several subranges, it is suitable to adapt the discharge resistance in such a way that the discharging times produced are not overly extremely far apart. A second controllable semiconductor switch is therefore provided, which enables a change in resistance by switching over. While relatively high-impedance discharge resistors remain connected even during the charging phase, since they only draw a negligible current, it is advantageous to disconnect correspondingly low-impedance discharge resistors from the charge circuit during the charging phase, and to switch the associated semiconductor switch in alternation with the first semiconductor switch.

Other features which are considered as characteristic for the invention are set forth in the appended claims.

Although the invention is illustrated and described herein as embodied in a measuring circuit for measuring a capacitance, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

The drawing is a schematic and block circuit diagram of an exemplary embodiment of the invention.

Referring now to the single FIGURE of the drawing in detail, there is seen an unknown capacitance Cx to be measured, which is located at a measuring circuit input having first and second poles and is charged during a charging phase to a predetermined final value of a charge voltage by a constant voltage source 1. The charge voltage of a capacitor charged through a resistor is known to asymptotically approach the value of a voltage UK2 output by the constant voltage source 1. The final value of the charge voltage is therefore defined in such a way that, depending on the allowable measuring tolerance, it is located only slightly below the constant voltage UK2 used for the charging.

The charge current flows from the constant voltage source 1 through a first switch S1 having a switching state which is determined by a flow control 2 and which is closed during the charging phase. A PTC element current limiting resistor RK, a so-called PTC element or cold conductor is incorporated into the charge current circuit between the first switch S1 and the capacitor Cx. In combination with two threshold value elements D1, D2 constructed as diodes, the PTC element protects the measurement circuit against external voltages that threaten it. If an overly high external voltage reaches the input of the measuring circuit, then it is quasi-short-circuited through one of the threshold value elements D1, D2, depending on its polarity. Since the short-circuit current of positive external voltages flows through a direct voltage source UG serving to supply current to the constant voltage source 1, a Zener diode Z is also connected in parallel for protection purposes. It limits the voltage drop produced by the short-circuit current at the direct voltage source UG.

Charging of the capacitor Cx takes place during a fixedly specified charging time, which is dimensioned in such a way that all of the capacitors located within the allowable measuring range are charged to at least the specified charge voltage. Following the charging time, the flow control 2 opens the first switch S1 and thus initiates the discharging phase. Discharging of the capacitor Cx takes place through a discharge resistor RE. This resistor may be switched over as needed with the aid of another or second switch S2 in accordance with the particular submeasuring range being selected, for the sake of better adaptation of the discharging time.

If the discharge resistor RE accordingly reaches a relatively low-impedance value, so that a significant leakage current would be created during the charging, the flow control must assure that the second switch S2 is controlled in push-pull operation with the first switch S1, or in other words remains open as long as the first switch S1 is closed.

The discharge of the capacitor Cx occurs until a specified discharge voltage, which is markedly below the charge voltage but definitely does not return to zero, is attained. Its voltage value is equivalent to a first reference voltage UR1 present at a first comparator 3, so that the comparator outputs a corresponding output signal as soon as the discharge voltage drops below the first reference voltage UR1. The flow control 2 has a counter in the form of a microprocessor P which counts clock pulses during the discharge, until the comparator signals that the discharge voltage at the capacitor Cx has dropped below the given first reference voltage UR1 and thus the discharge time is ended.

Upon the conclusion of the discharge phase, the capacitor Cx is charged again. However, if its capacitance exceeds the allowable capacitance measuring range, then the capacitor Cx does not charge to the specified charge voltage within the fixed charging time, because of the high charge time constant effected by the PTC element RK. On the other hand, if the charge voltage remains below the first reference voltage UR1, then the first comparator 3 cannot return to the output state necessary for the discharging. As a result, the flow control is already misled at the beginning of the discharging, because the specified discharge voltage is reached quasi in zero time, or in other words an extremely small capacitor is involved. In order to avoid incorrect indications resulting therefrom, the flow control is programmed in such a way that it monitors the first comparator 3 as to whether or not its output signal undergoes any signal change during the charging phase. If not, then with the aid of a display unit 5, an overflow signal is generated, which makes it apparent that the capacitance to be measured is exceeding the allowable range.

If the capacitance to be measured is precisely large enough that its charge voltage drops into the range between the first reference voltage UR1 and the specified charge voltage, then a very small capacitance is initially misleadingly simulated. However, since charging of the capacitor begins at a voltage level defined by the applicable discharge voltage in every measuring cycle, the charge voltage in one of the following measuring cycles attains the specified final value of the charge voltage, so that the measured value being displayed likewise reaches the overflow very quickly.

As an alternative to the sliding overflow of the kind that arises with certain capacitors, if overly high capacitances are to be detected solely by the first comparator 3 that is acted upon only by a first reference voltage UR1, then it is also possible, as shown in dashed lines, to use another or second reference voltage UR2. With the aid of a flow control, a third switch S3 would have to be controlled in such a way that the second reference voltage UR2 is turned on during the charging phase, while the first reference voltage UR1 is turned on during the discharging phase. In that case the second reference voltage UR2 would have to correspond to the specified charge voltage. Once again, all that takes place is the signaling of an overflow, in the manner described above.

Finally, as an another alternative, the possibility exists of using another or second comparator 4 with a further or third reference voltage UR3, instead of the second reference voltage UR2. The third reference voltage UR3 corresponding to the specified charging voltage must be reached by the charge voltage during the charging phase, so that the flow control 2 or an associated measured value processing circuit will not generate any overflow signal.

The resistors connected to the input side of the two comparators 3, 4 have the task of limiting the input current. An operational amplifier belonging to the constant voltage source 1 is connected to a transistor and two resistors disposed downstream, as a voltage amplifier. This voltage amplifier amplifies a first constant voltage UK1 that is supplied to it on the input side, into the second constant voltage UK2.

We claim:

1. A measuring circuit for measuring a capacitance according to the discharge method, comprising:
    a measuring circuit input;
    a constant voltage source for charging a capacitor to be measured at said measuring circuit input;
    a discharge resistor with a known resistance being connected to the capacitor and through which the capacitor discharges;
    at least one switch connected between the capacitor and said constant voltage source;
    flow control means in the form of a microprocessor connected to said at least one switch for controlling said at least one switch to determine charging and discharging phases;
    a comparator connected to the capacitor, said comparator issuing an output signal;
    a counter associated with said microprocessor and connected to said comparator for counting clock pulses during a discharge until said comparator signals that a discharge voltage at the capacitor has dropped below a given reference voltage and therefore a discharge time is ended;
    current limiting resistor means for protecting against error voltages connected to said measuring circuit input in series with the capacitor, a charging current passing through said current limiting resistor means, for limiting a time constant for the charging, being increased through said current limiting resistor means, to a maximum value by a restriction of an allowable capacitance range, and for maintaining a charging time of the capacitor within a scope of typical measuring times; and
    said comparator having means for preventing incorrect displays and for detecting if, within a fixed given charging time, a charge voltage does not attain a given voltage value because the capacitor exceeds the maximum value of the allowable capacitance range, and for detecting if a given minimum value of the charge voltage is attained at the capacitor and for delivering a corresponding output signal to said flow control means, said flow control means being programmed for detecting, from the output signal of said comparator, if the given minimum value of the charge voltage was exceeded during the fixed given charging time.

2. The measuring circuit according to claim 1, wherein said comparator detects the attainment of a charge voltage corresponding to the reference voltage and supplies a signal to said flow control means, during the charging of the capacitor.

3. The measuring circuit according to claim 1, wherein said comparator detects, with the aid the reference voltage, if the given discharge voltage is attained, and effects a switchover between the reference voltage and another reference voltage equivalent to a given voltage value, so that said comparator detects the attainment of a charge voltage corresponding to the other reference voltage and supplies a signal to said flow control means, during the charging of the capacitor.

4. The measuring circuit according to claim 3, including another comparator having an input at another reference voltage being equivalent to the given voltage value, said other comparator detecting the attainment of a charge voltage equivalent to the other reference voltage and supplying a signal to said flow control means, during the charging of the capacitor.

5. The measuring circuit according to claim 1, wherein said at least one switch is a semiconductor switch connected between said constant voltage source and said current limiting resistor means, for interrupting the charging and beginning the discharging through said discharge resistor upon opening said at least one switch.

6. The measuring circuit according to claim 1, including another controllable switch switching over for enabling a variation in resistance of said discharge resistor.

7. The measuring circuit according to claim 6, wherein the switchover of said other switch is intended to reduce resistance and takes place at correspondingly low resistances of said discharge resistor, said other switch being switched in alternation with said at least one switch.

8. The measuring circuit according to claim 1, wherein said measuring circuit input has first and second terminals with first and second poles, and including a direct voltage source for supplying said constant voltage source, and two threshold value elements disposed at said measuring circuit input upstream of said current limiting resistor means for short-circuiting external voltages of one polarity directly to the second pole of said measuring circuit input, and short-circuiting external voltages of the other polarity to the second pole of said measuring circuit input, through said direct voltage source.

9. The measuring circuit according to claim 8, wherein said threshold value elements are diodes.

10. The measuring circuit according to claim 8, including a Zener diode connected parallel to said direct voltage source.

11. The measuring circuit according to claim 1, wherein said current limiting resistor means are a PTC resistor element.

12. A measuring circuit for measuring a capacitance according to the discharge method, comprising:
    a measuring circuit input;

a constant voltage source for charging a capacitor to be measured at said measuring circuit input;

discharge resistor with a known resistance being connected to the capacitor and through which the capacitor discharges;

at least one switch connected between the capacitor and said constant voltage source;

a flow control being connected to said at least one switch for controlling said at least one switch;

a comparator connected to the capacitor;

a counter connected to said comparator for counting clock pulses during a discharge;

a current limiting resistor means connected to said measuring circuit input in series with the capacitor; and monitoring means connected to the capacitor.

* * * * *